(12) United States Patent
Tanaka et al.

(10) Patent No.: US 11,482,662 B2
(45) Date of Patent: Oct. 25, 2022

(54) ALUMINUM NITRIDE FILM, PIEZOELECTRIC DEVICE, RESONATOR, FILTER, AND MULTIPLEXER

(71) Applicant: TAIYO YUDEN CO., LTD., Tokyo (JP)

(72) Inventors: Kuniaki Tanaka, Tokyo (JP); Tokihiro Nishihara, Tokyo (JP); Tomonori Yamatoh, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 880 days.

(21) Appl. No.: 16/370,128

(22) Filed: Mar. 29, 2019

(65) Prior Publication Data
US 2019/0363243 A1     Nov. 28, 2019

(30) Foreign Application Priority Data

May 28, 2018   (JP) .............................. JP2018-101377

(51) Int. Cl.
  *H01L 41/18*        (2006.01)
  *C30B 29/40*        (2006.01)
  (Continued)

(52) U.S. Cl.
  CPC ............ *H01L 41/18* (2013.01); *C30B 29/403* (2013.01); *H01L 41/0805* (2013.01); *H03H 3/02* (2013.01);
  (Continued)

(58) Field of Classification Search
  CPC ... H01L 41/18; H01L 41/0805; C30B 29/403; H03H 3/02; H03H 9/581
  (Continued)

(56) References Cited

U.S. PATENT DOCUMENTS

| 9,246,079 B2 | 1/2016 | Umeda et al. ................... 41/18 |
| 2004/0013544 A1 | 7/2004 | Yamada et al. ................. 257/59 |

(Continued)

FOREIGN PATENT DOCUMENTS

| JP | 2002-344279 A | 11/2002 |
| JP | 2009-10926 A | 1/2009 |

(Continued)

OTHER PUBLICATIONS

Notification of Reasons for Refusal dated Nov. 9, 2021 in a counterpart Japanese Patent Application No. 2018-101377.

*Primary Examiner* — David Vu
*Assistant Examiner* — Brandon C Fox
(74) *Attorney, Agent, or Firm* — Stein IP, LLC

(57) ABSTRACT

Provided is an aluminum nitride film in which, aluminum nitride crystal grains containing a metal element differing from aluminum and substituting for aluminum are main crystal grains of a polycrystalline film formed of crystal grains, and a concentration of the metal element in a grain boundary between the aluminum nitride crystal grains in at least one region of first and second regions corresponding to both end portions of the polycrystalline film in a film thickness direction of the polycrystalline film is higher than a concentration of the metal element in a center region of the aluminum nitride crystal grain in the at least one region, and is higher than a concentration of the metal element in a grain boundary between the aluminum nitride crystal grains in a third region located between the first region and the second region in the film thickness direction of the polycrystalline film.

11 Claims, 11 Drawing Sheets

(51) Int. Cl.
*H03H 9/17* (2006.01)
*H03H 9/58* (2006.01)
*H03H 3/02* (2006.01)
*H01L 41/08* (2006.01)

(52) U.S. Cl.
CPC ............ H03H 9/173 (2013.01); H03H 9/581 (2013.01); *H03H 2003/021* (2013.01)

(58) Field of Classification Search
USPC .......................................................... 310/311
See application file for complete search history.

(56) References Cited

U.S. PATENT DOCUMENTS

| | | | |
|---|---|---|---|
| 2004/0135144 A1 | 7/2004 | Yamada et al. | 257/59 |
| 2008/0296529 A1 | 12/2008 | Akiyama et al. | |
| 2012/0107557 A1 | 5/2012 | Akiyama et al. | 428/141 |
| 2013/0127300 A1 | 5/2013 | Umeda et al. | 310/365 |
| 2013/0241673 A1 | 9/2013 | Yokoyama et al. | 333/189 |
| 2014/0167560 A1 | 6/2014 | Onda | 310/311 |
| 2014/0354109 A1* | 12/2014 | Grannen | H03H 9/171 310/311 |
| 2015/0022274 A1* | 1/2015 | Yamazaki | H01L 41/18 204/192.18 |
| 2015/0357555 A1* | 12/2015 | Umeda | H01L 41/316 204/192.18 |
| 2018/0026604 A1 | 1/2018 | Yokoyama et al. | 9/17 |
| 2018/0069528 A1* | 3/2018 | Qiu | H03H 9/173 |

FOREIGN PATENT DOCUMENTS

| | | |
|---|---|---|
| JP | 2011-15148 A | 1/2011 |
| JP | 2013-128267 A | 6/2013 |
| JP | 2013-219743 A | 10/2013 |
| JP | 2014-121025 A | 6/2014 |
| JP | 2018-14643 A | 1/2018 |

* cited by examiner

N

O

Sc

Al

ALUMINUM NITRIDE FILM, PIEZOELECTRIC DEVICE, RESONATOR, FILTER, AND MULTIPLEXER

CROSS-REFERENCE TO RELATED APPLICATION

This application is based upon and claims the benefit of priority of the prior Japanese Patent Application No. 2018-101377, filed on May 28, 2018, the entire contents of which are incorporated herein by reference.

FIELD

A certain aspect of the present invention relates to an aluminum nitride film, a piezoelectric device, a resonator, a filter, and a multiplexer.

BACKGROUND

An aluminum nitride film has been used as a piezoelectric film in piezoelectric devices such as piezoelectric thin film resonators and acoustic wave devices. It has been known that the addition of scandium to the aluminum nitride film improves the piezoelectricity as disclosed in, for example, Japanese Patent Application Publication No. 2011-15148 (hereinafter, referred to as Patent Document 1). It has been known that the addition of a Group II or Group XII element and a Group IV or Group V element to the aluminum nitride film improves the piezoelectricity as disclosed in, for example, Japanese Patent Application Publications Nos. 2013-219743, 2014-121025, and 2018-14643 (hereinafter, referred to as Patent Documents 2 to 4, respectively). It has been known that the additive element segregated in the crystal grain boundary increases when large amounts of a Group II element and a Group III element are added to the aluminum nitride film as disclosed in, for example, Japanese Patent Application Publication No. 2002-344279 (hereinafter, referred to as Patent Document 5).

SUMMARY OF THE INVENTION

According to a first aspect of the present invention, there is provided an aluminum nitride film, wherein aluminum nitride crystal grains that contain a metal element, which is different from aluminum and substitutes for aluminum, are main crystal grains of a polycrystalline film formed of a plurality of crystal grains, and a concentration of the metal element in a grain boundary between the aluminum nitride crystal grains in at least one region of a first region and a second region, which correspond to both end portions of the polycrystalline film in a film thickness direction of the polycrystalline film, is higher than a concentration of the metal element in a center region of the aluminum nitride crystal grain in the at least one region, and is higher than a concentration of the metal element in a grain boundary between the aluminum nitride crystal grains in a third region located between the first region and the second region in the film thickness direction of the polycrystalline film.

According to a second aspect of the present invention, there is provided a piezoelectric device including: a substrate; the aluminum nitride film according to any one of claims 1 through 3, the aluminum nitride film being located on the substrate; and a first electrode and a second electrode facing each other across at least a part of the aluminum nitride film in the film thickness direction, the first electrode being in contact with the first region, the second electrode being in contact with the second region.

According to a third aspect of the present invention, there is provided a resonator including: a substrate; the above aluminum nitride film located on the substrate; and a first electrode and a second electrode facing each other across at least a part of the aluminum nitride film in the film thickness direction, the first electrode being in contact with the first region, the second electrode being in contact with the second region.

According to a fourth aspect of the present invention, there is provided a filter including the above resonator.

According to a fifth aspect of the present invention, there is provided a multiplexer including the above filter.

DETAILED DESCRIPTION

When the aluminum nitride film is used in the piezoelectric device or the acoustic wave device, the mechanical strength such as formation of cracks on the surface of the aluminum nitride film becomes a problem.

Hereinafter, with reference to the accompanying drawings, embodiments will be described.

First Embodiment

Figure 1A:
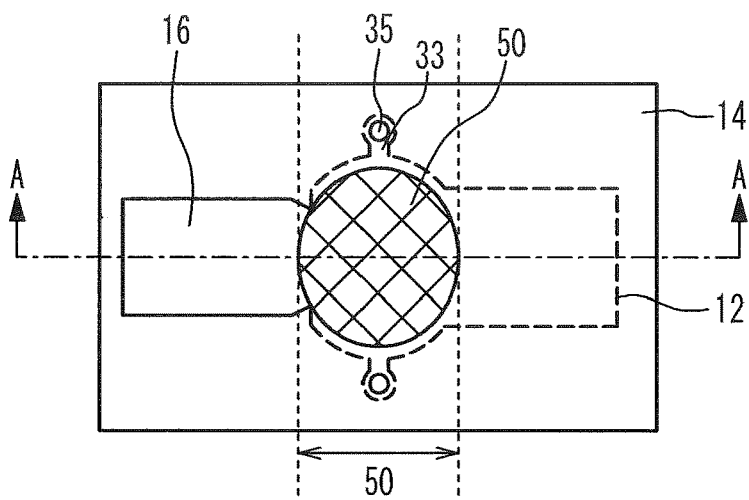
FIG. 1A is a plan view of a piezoelectric thin film resonator in accordance with a first embodiment.
Figure 1B:
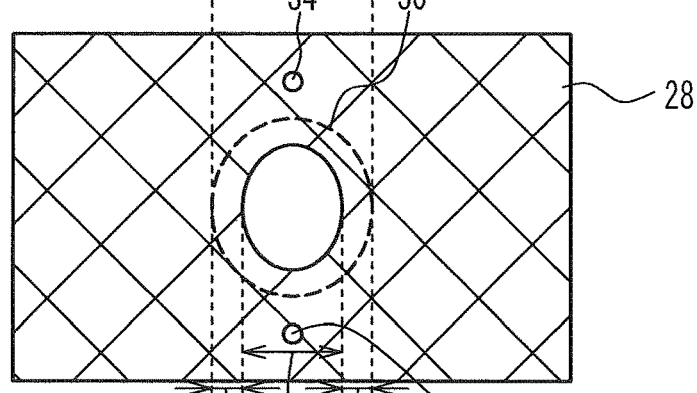
FIG. 1B is a plan view of an insertion film.
Figure 1C:
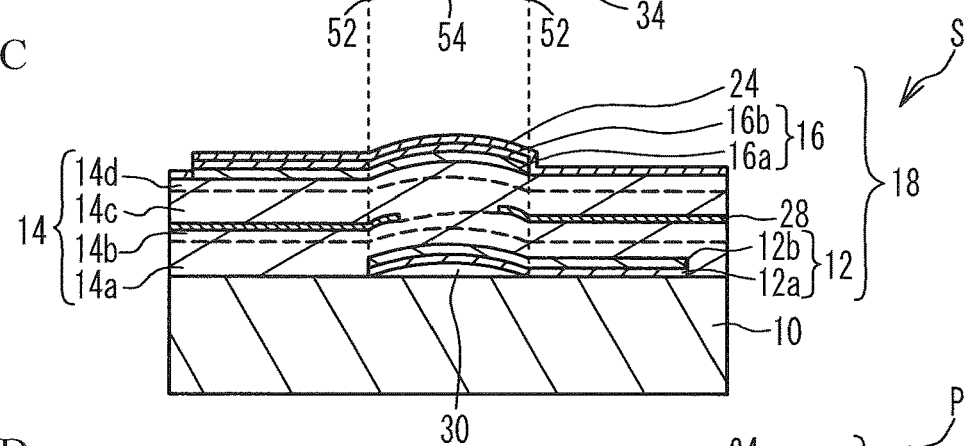
FIG. 1C and FIG. 1D are cross-sectional views taken along line A-A in FIG. 1A.
Figure 1D:
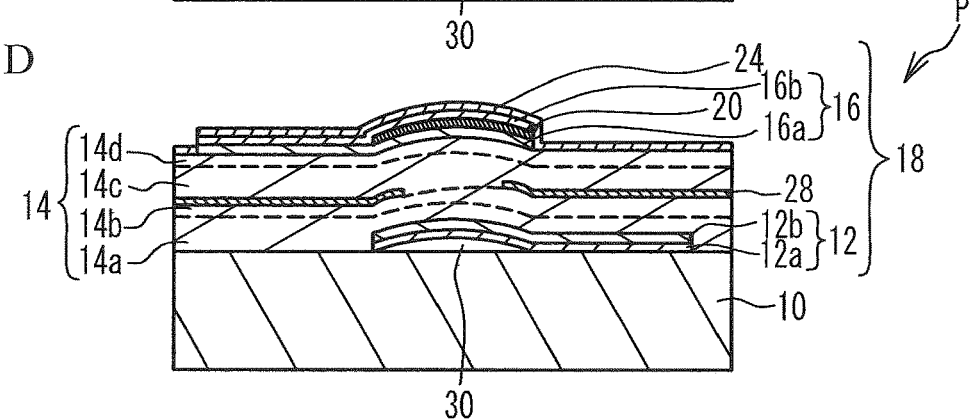

FIG. 1A is a plan view of a piezoelectric thin film resonator in accordance with a first embodiment, FIG. 1B is a plan view of an insertion film, and FIG. 1C and FIG. 1D are cross-sectional views taken along line A-A in FIG. 1A. FIG. 1C is a cross-sectional view of, for example, a series resonator of a ladder-type filter, and FIG. 1D is a cross-sectional view of, for example, a parallel resonator of the ladder-type filter.

With reference to FIG. 1A through FIG. 1C, the structure of a series resonator S will be described. A lower electrode 12 is located on a substrate 10. An air gap 30 having a dome-shaped bulge is formed between the flat principal surface of the substrate 10 and the lower electrode 12. The dome-shaped bulge is a bulge having a shape in which the height of the air gap 30 is small in the periphery of the air gap 30, and increases at closer distances to the center of the air gap 30, for example. The substrate 10 is, for example, a silicon (Si) substrate. The lower electrode 12 includes a lower layer 12a and an upper layer 12b. The lower layer 12a is formed of, for example, a chrome (Cr) film, and the upper layer 12b is formed of, for example, a ruthenium (Ru) film.

A piezoelectric film 14 is located on the lower electrode 12. The piezoelectric film 14 is an aluminum nitride film mainly composed of aluminum nitride having the (0001) direction as a main axis (i.e., having a c-axis orientation). The piezoelectric film 14 has a region 14a that is in contact with the lower electrode 12, a region 14d that is in contact with an upper electrode 16, and regions 14b and 14c located between the region 14a and the region 14d. A metal element that enhances the piezoelectricity of the aluminum nitride film is added more to the regions 14a and 14d than to the regions 14b and 14c.

Examples of the metal element that enhances the piezoelectricity of the aluminum nitride film include, but are not limited to, scandium (Sc) as in Patent Document 1, and a Group II or Group XII element and a Group IV or Group V element as in Patent Documents 2 through 4. The name of the group of the element is as per description in International Union of Pure and Applied Chemistry (IUPAC). The Group II element is, for example, calcium (Ca), magnesium (Mg), or strontium (Sr). The Group XII element is, for example, zinc (Zn). The Group IV element is, for example, titanium (Ti), zirconium (Zr), or hafnium (Hf). The Group V element is, for example, tantalum (Ta), niobium (Nb), or vanadium (V).

An insertion film 28 is located between the regions 14b and 14c in the piezoelectric film 14. The insertion film 28 is, for example, a silicon oxide film. The insertion film 28 is located in an outer peripheral region 52 in the resonance region 50, and is not located in a center region 54. The insertion film 28 is continuously located from the outer peripheral region 52 to the outside of the resonance region 50. Hole portions 34 corresponding to hole portions 35 are located in the insertion film 28.

The upper electrode 16 is located on the piezoelectric film 14 so as to have the region where the upper electrode 16 faces the lower electrode 12 across the piezoelectric film 14 (a resonance region 50). The resonance region 50 is a region having an elliptical shape, and in which the acoustic wave in the thickness extension mode resonates. The upper electrode 16 includes a lower layer 16a and an upper layer 16b. The lower layer 16a is formed of, for example, a Ru film, and the upper layer 16b is formed of, for example, a Cr film.

A silicon oxide film is formed, as a frequency adjusting film 24, on the upper electrode 16. A multilayered film 18 in the resonance region 50 includes the lower electrode 12, the piezoelectric film 14, the insertion film 28, the upper electrode 16, and the frequency adjusting film 24. The frequency adjusting film 24 may function as a passivation film.

As illustrated in FIG. 1A, an introduction path 33 for etching a sacrifice layer is formed in the lower electrode 12. The sacrifice layer is a layer for forming the air gap 30. The vicinity of the end of the introduction path 33 is not covered with the piezoelectric film 14, and the lower electrode 12 has the hole portions 35 at the ends of the introduction path 33.

With reference to FIG. 1A and FIG. 1D, the structure of a parallel resonator P will be described. The parallel resonator P differs from the series resonator S in that a mass load film 20 formed of a titanium (Ti) layer is located between the lower layer 16a and the upper layer 16b of the upper electrode 16. Thus, the multilayered film 18 includes the mass load film 20 formed across the entire surface in the resonance region 50 in addition to the multilayered film of the series resonator S. Other structures are the same as those of the series resonator S illustrated in FIG. 1C, and the description thereof is thus omitted.

Difference in resonant frequency between the series resonator S and the parallel resonator P is adjusted with use of the film thickness of the mass load film 20. The resonant frequency of each of the series resonator S and the parallel resonator P is adjusted by adjusting the film thickness of the corresponding frequency adjusting film 24.

In the case of the piezoelectric thin film resonator having a resonant frequency of 2 GHz, the lower layer 12a, formed of a Cr film, of the lower electrode 12 has a film thickness of 100 nm, and the upper layer 12b formed of a Ru film has a film thickness of 210 nm. The piezoelectric film 14 formed of an AlN film has a film thickness of 1100 nm. The insertion film 28 formed of a silicon oxide film has a film thickness of 150 nm. The lower layer 16a, formed of a Ru film, of the upper electrode 16 has a film thickness of 230 nm, and the upper layer 16b formed of a Cr film has a film thickness of 50 nm. The frequency adjusting film 24 formed of a silicon oxide film has a film thickness of 50 nm. The mass load film 20 formed of a Ti film has a film thickness of 120 nm. The film thickness of each layer can be appropriately configured so as to achieve desired resonance characteristics.

The substrate 10 may be a sapphire substrate, an alumina substrate, a spinel substrate, a quartz substrate, a crystal substrate, a glass substrate, a ceramic substrate, or a GaAs substrate instead of a Si substrate. The lower electrode 12 and the upper electrode 16 may be formed of a single-layer film made of aluminum (Al), Ti, copper (Cu), molybdenum (Mo), tungsten (W), tantalum (Ta), platinum (Pt), rhodium (Rh), or iridium (Ir) or a multilayered film of at least two of them, instead of Ru and Cr. For example, the lower layer 16a of the upper electrode 16 may be made of Ru, and the upper layer 16b may be made of Mo.

The insertion film 28 is made of a material having smaller Young's modulus than the piezoelectric film 14 and/or smaller acoustic impedance than the piezoelectric film 14. The insertion film 28 may be a single-layer film of aluminum (Al), gold (Au), Cu, Ti, Pt, Ta, or Cr or a multilayered film of at least two of them, instead of silicon oxide.

The frequency adjusting film 24 may be a silicon nitride film or an aluminum nitride film instead of a silicon oxide film. The mass load film 20 may be a single-layer film of Ru, Cr, Al, Cu, Mo, W, Ta, Pt, Rh, or Ir instead of Ti. Alternatively, an insulating film made of, for example, metal nitride such as silicon nitride or metal oxide such as silicon oxide may be used. The mass load film 20 may be formed under the lower electrode 12, between the layers of the lower electrode 12, on the upper electrode 16, between the lower electrode 12 and the piezoelectric film 14, or between the piezoelectric film 14 and the upper electrode 16 instead of between the layers of the upper electrode 16 (between the lower layer 16a and the upper layer 16b). The mass load film 20 may be larger than the resonance region 50 as long as the mass load film 20 is formed so as to include the resonance region 50.

Fabrication Method of the First Embodiment

Figure 2A:
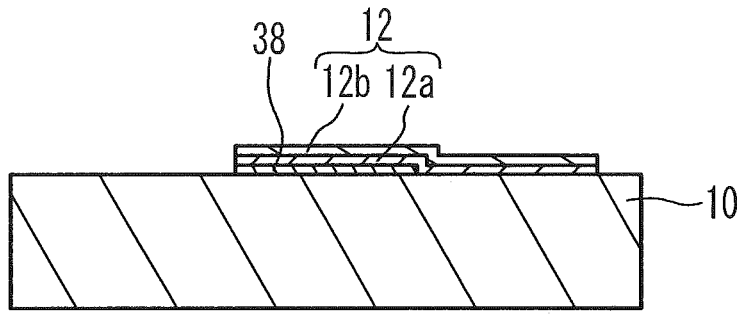
FIG. 2A through FIG. 2C are cross-sectional views illustrating a method of fabricating the series resonator in accordance with the first embodiment.
Figure 2B:
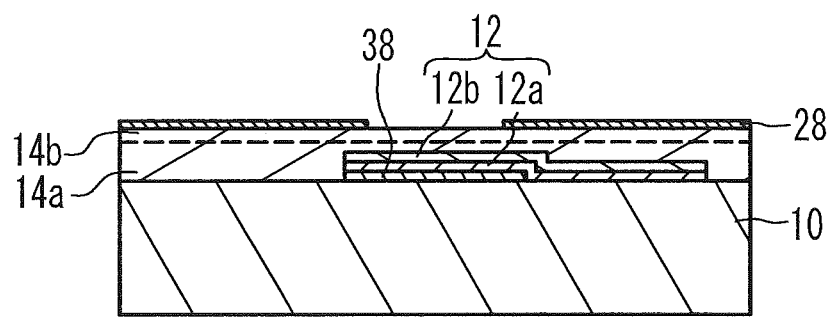
Figure 2C:
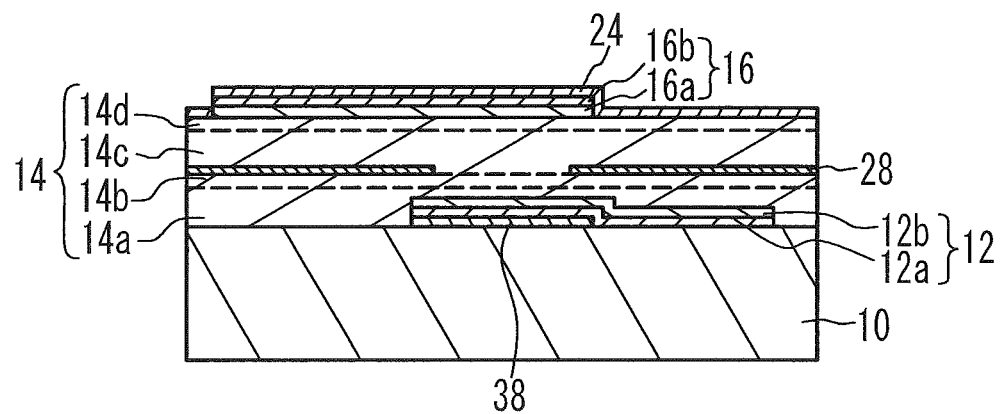

FIG. 2A through FIG. 2C are cross-sectional views illustrating a method of fabricating the series resonator in accordance with the first embodiment. As illustrated in FIG. 2A, a sacrifice layer 38 for forming an air gap is formed on the substrate 10 having a flat principal surface. The sacrifice layer 38 has a film thickness of, for example, 10 to 100 nm, and is formed of a material selected from materials, such as MgO, ZnO, Ge, and $SiO_2$, easily dissolving in an etching liquid or an etching gas. Thereafter, the sacrifice layer 38 is patterned into a desired shape by photolithography and etching. The shape of the sacrifice layer 38 corresponds to the planar shape of the air gap 30, and includes, for example, the region to be the resonance region 50. Then, the lower layer 12a and the upper layer 12b are formed, as the lower electrode 12, on the sacrifice layer 38 and the substrate 10. The sacrifice layer 38 and the lower electrode 12 are formed by, for example, sputtering, vacuum evaporation, or chemical vapor deposition (CVD). Thereafter, the lower electrode 12 is patterned into a desired shape by photolithography and etching. The lower electrode 12 may be formed by liftoff.

As illustrated in FIG. 2B, the regions 14a and 14b of the piezoelectric film 14 and the insertion film 28 are formed on the lower electrode 12 and the substrate 10 by, for example, sputtering, vacuum evaporation, or CVD. The insertion film 28 is patterned into a desired shape by photolithography and etching. The insertion film 28 may be formed by liftoff.

As illustrated in FIG. 2C, the regions 14c and 14d of the piezoelectric film 14 and the lower layer 16a and the upper layer 16b of the upper electrode 16 are formed by, for example, sputtering, vacuum evaporation, or CVD. The regions 14a through 14d form the piezoelectric film 14. The upper electrode 16 is patterned into a desired shape by photolithography and etching. The upper electrode 16 may be formed by liftoff.

In the parallel resonator illustrated in FIG. 1D, after the lower layer 16a is formed, the mass load film 20 is formed by, for example, sputtering, vacuum evaporation, or CVD. The mass load film 20 is patterned into a desired shape by photolithography and etching. Thereafter, the upper layer 16b is formed.

The frequency adjusting film 24 is formed by, for example, sputtering or CVD. The frequency adjusting film 24 is patterned into a desired shape by photolithography and etching.

Thereafter, an etching liquid for the sacrifice layer 38 is introduced into the sacrifice layer 38 under the lower electrode 12 through the hole portions 35 and the introduction path 33 (see FIG. 1A). This process removes the sacrifice layer 38. A substance for etching the sacrifice layer 38 is preferably a substance that does not etch materials constituting the resonator other than the sacrifice layer 38. In particular, the substance for etching is preferably a substance that does not etch the lower electrode 12 with which the etching substance comes into contact. The stress of the multilayered film 18 (see FIG. 1C and FIG. 1D) is set so as to be a compression stress. This setting causes the multilayered film 18 to bulge out to the side opposite to the substrate 10 so as to separate from the substrate 10 when the sacrifice layer 38 is removed. The air gap 30 having a dome-shaped bulge is formed between the lower electrode 12 and the substrate 10. Through the above-described processes, the series resonator S illustrated in FIG. 1A and FIG. 1C and the parallel resonator P illustrated in FIG. 1A and FIG. 1D are fabricated.

Method of Forming an Aluminum Nitride Film

Figure 3A:
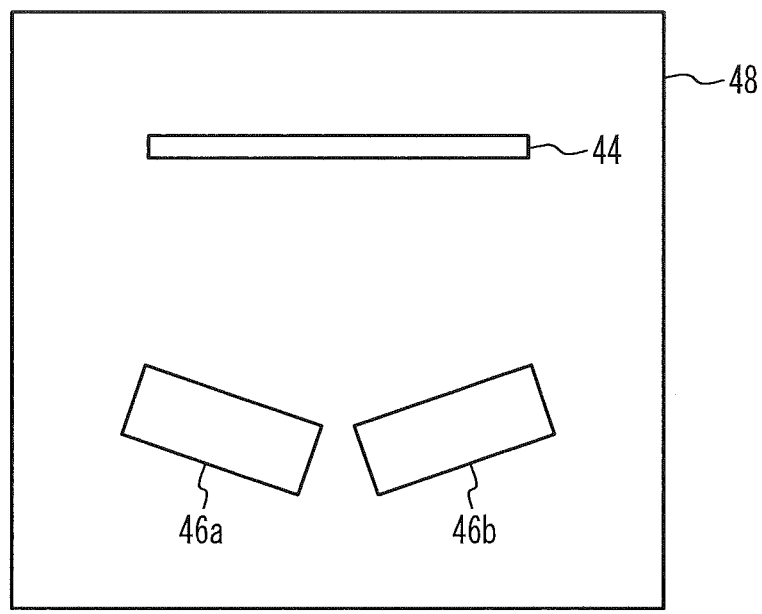
FIG. 3A is a schematic view of a sputtering device in the first embodiment.
Figure 3B:
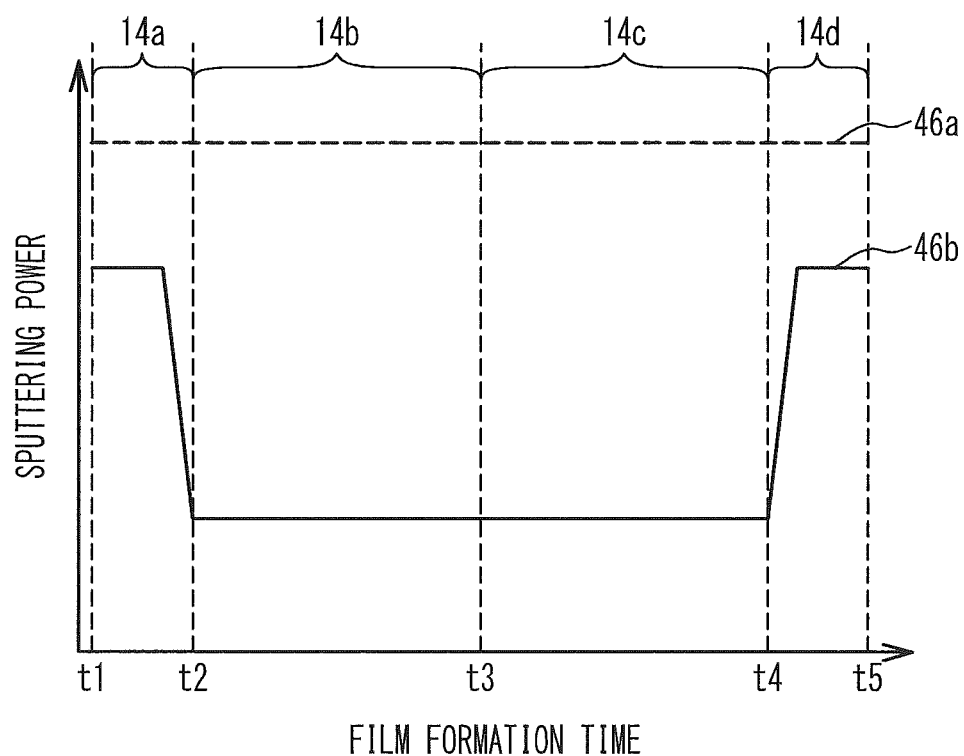
FIG. 3B illustrates sputtering power with respect to film formation time.

For example, a reactive sputtering method is one of the methods for forming the aluminum nitride film as the piezoelectric film 14. A description will be given of a case where one type of metal element such as Sc is added to an aluminum nitride film. FIG. 3A is a schematic view of a sputtering device in the first embodiment, and FIG. 3B illustrates sputtering power with respect to film formation time. As illustrated in FIG. 3A, a substrate 44 and targets 46a and 46b are placed in a chamber 48. The target 46a is an Al target, and the target 46b is a target of a metal element to be added (for example, a Sc target). For example, a mixture of nitrogen ($N_2$) gas and argon (Ar) is introduced into the chamber 48. Atoms sputtered from the targets 46a and 46b react with nitrogen, and the reactant is deposited on the substrate 44. As a method for applying a voltage to the targets 46a and 46b, for example, an AC magnetron sputtering method that applies an alternating current (AC) voltage to the targets 46a and 46b is available. Sputtering power can be separately applied to the targets 46a and 46b.

FIG. 3B illustrates sputtering power applied to the targets 46a and 46b. In FIG. 2B, before the regions 14a and 14b are formed, the substrate 10 is placed in the chamber 48. When gas is introduced, and sputtering power is then applied at time t1, the region 14a is formed. AlN to which a metal element (for example, Sc) is added is formed in the region 14a. At time t2, the sputtering power for the target 46b is reduced while the sputtering power for the target 46a is maintained. Accordingly, the region 14b in which the concentration of the metal element is less than that in the region 14a is formed. At time t3, the film formation is finished. The substrate 10 is taken out from the chamber 48, and the insertion film 28 is formed.

In FIG. 2C, the substrate 10 is brought in the chamber 48. A mixture of gasses is introduced into the chamber 48, and sputtering power is applied to the targets 46a and 46b. The sputtering power is the same as the sputtering power between time t2 and time t3. This process forms the region 14c in which the concentration of the metal element is approximately equal to that in the region 14b. At time t4, the sputtering power for the target 46b is increased while the sputtering power for the target 46a is maintained. This process forms the region 14d in which the concentration of the metal element is greater than that in the region 14c. At time t5, the film formation is finished. Thereafter, the substrate 10 is taken out from the chamber 48, and the upper electrode 16 is formed.

Figure 4A:
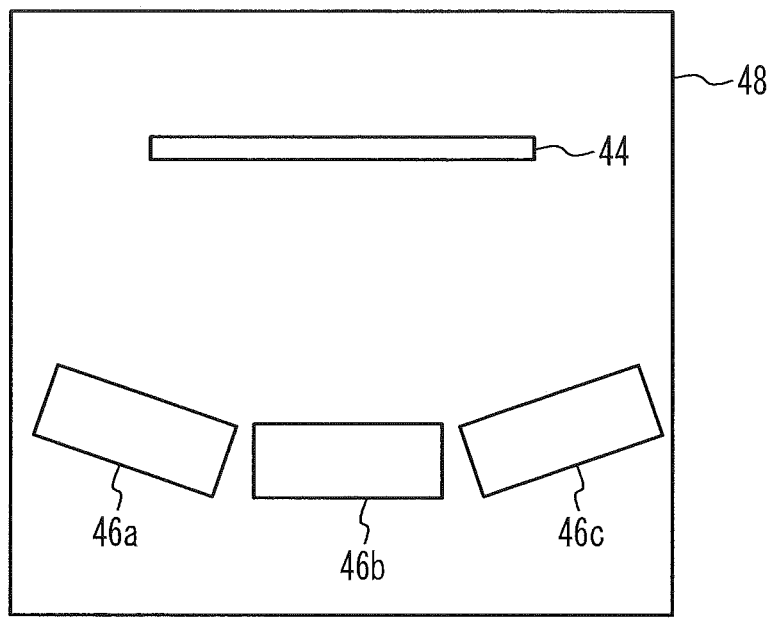
FIG. 4A is a schematic view of another sputtering device in the first embodiment.
Figure 4B:
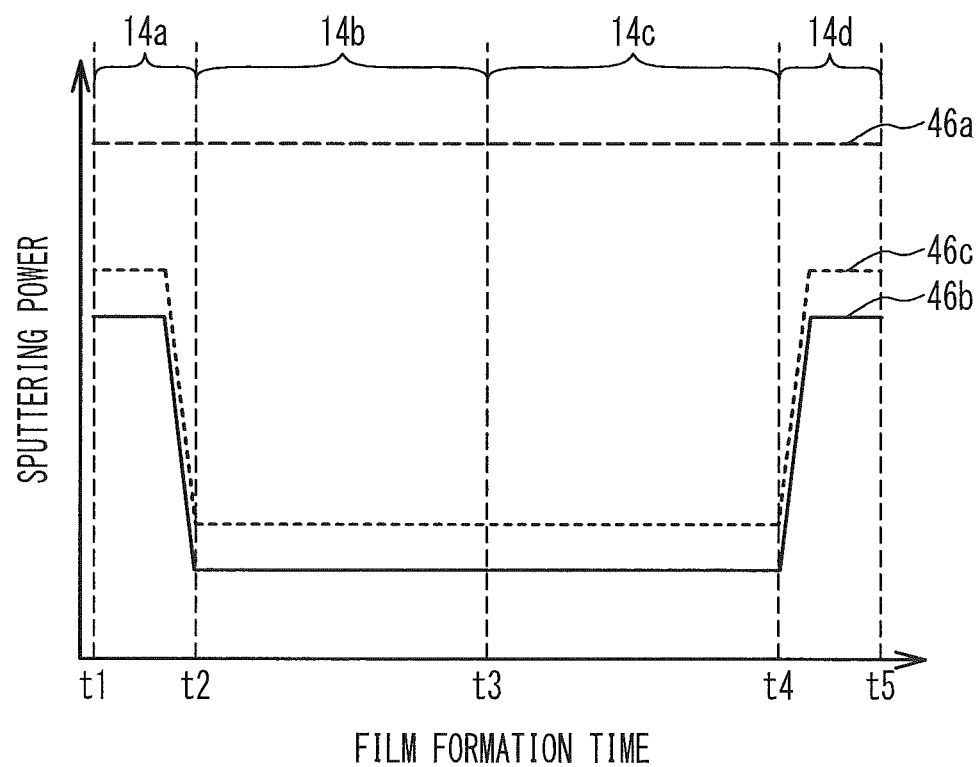
FIG. 4B illustrates sputtering power with respect to film formation time.

A description will be given of a case where two or more types of metal elements such as Mg and Hf are added to the aluminum nitride film. FIG. 4A is a schematic view of another sputtering device in the first embodiment, and FIG. 4B illustrates sputtering power with respect to film formation time. As illustrated in FIG. 4A, in the chamber 48, the target 46a is an Al target, and targets 46b and 46c are targets of metal elements (for example, a Mg target and a Hf target, respectively). Other structures are the same as those illustrated in FIG. 3A, and the description thereof is thus omitted.

As illustrated in FIG. 4B, the sputtering power applied to each of the targets 46b and 46c from time t2 to time t4 is configured to be less than the sputtering power applied to each of the targets 46b and 46c from time t1 to time t2 and from time t4 to time t5, respectively. This configuration allows the total concentration of the metal elements (for example, Mg and Hf) in the regions 14b and 14c to be less than the total concentration of the metal elements in the regions 14a and 14d.

As described above, the concentration of the metal element in each of the regions 14a through 14d can be controlled by controlling the sputtering power applied to each of the targets 46a through 46c. The targets 46b and 46c may be an alloy of Al and a metal element.

Evaluation of the Aluminum Nitride Film

The aluminum nitride film to which Sc is added was evaluated by high-angle annular dark field scanning transmission electron microscopy (HAADF-STEM) and energy dispersive X-ray spectrometry (EDS).

Figure 5A:
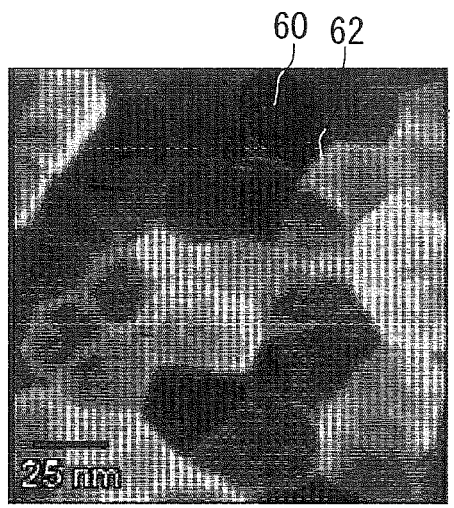
FIG. 5A is an HAADF-STEM image of AlN to which Sc is added.
Figure 5B:
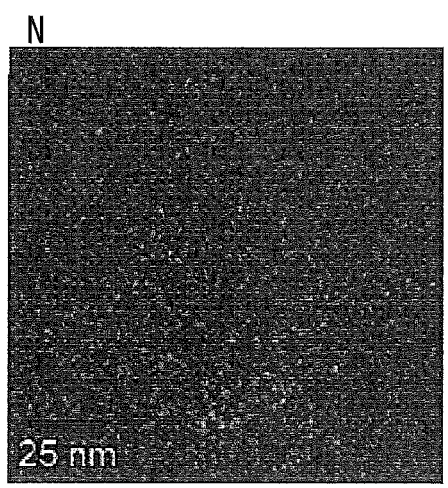
FIG. 5B through FIG. 5E are EDS surface analysis images.
Figure 5C:
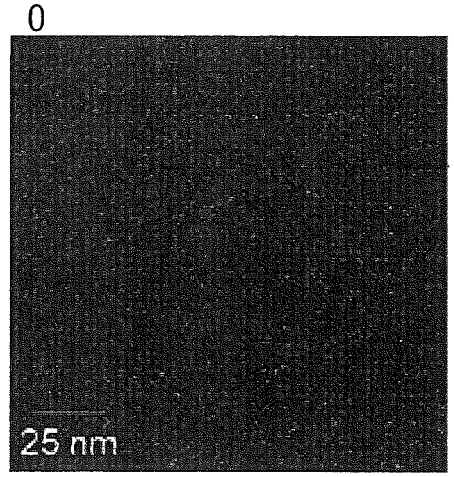

FIG. 5A is an HAADF-STEM image of AlN to which Sc is added, and FIG. 5B through FIG. 5E are EDS surface analysis images. FIG. 5B through FIG. 5E map the K-lines of nitrogen (N), oxygen (O), Sc, and Al in the same arrangement as FIG. 5A, respectively. The pale region indicates that a large amount of the corresponding element are contained.

As presented in FIG. 5A, a plurality of crystal grains 60 and grain boundaries 62 are observed. A main crystal grain of a polycrystalline film formed of a plurality of the crystal grains 60 is an aluminum nitride crystal grain. The aluminum nitride crystal grain has a wurtzite-type crystal structure in which crystal grains are oriented in the c-axis. As presented in FIG. 5B and FIG. 5C, O and N are uniformly distributed regardless of the crystal grains and the grain boundaries. As presented in FIG. 5D, Sc is distributed more in the grain boundaries. As presented in FIG. 5E, Al is distributed somewhat near the grain boundaries. As seen above, it is revealed that Sc is distributed more in the grain boundaries 62. It is considered that at least a part of Sc in the grain boundary 62 substitutes for Al, but it is unknown whether it precipitates as Sc alone.

The atomic concentrations of N, O, Al, and Sc (the atomic concentration of each element with respect to the sum of N, O, Al, and Sc) calculated from FIG. 5B through FIG. 5E are 23.36 atomic %, 1.13 atomic %, 72.15 atomic %, and 3.36 atomic %, respectively.

Figure 6A:
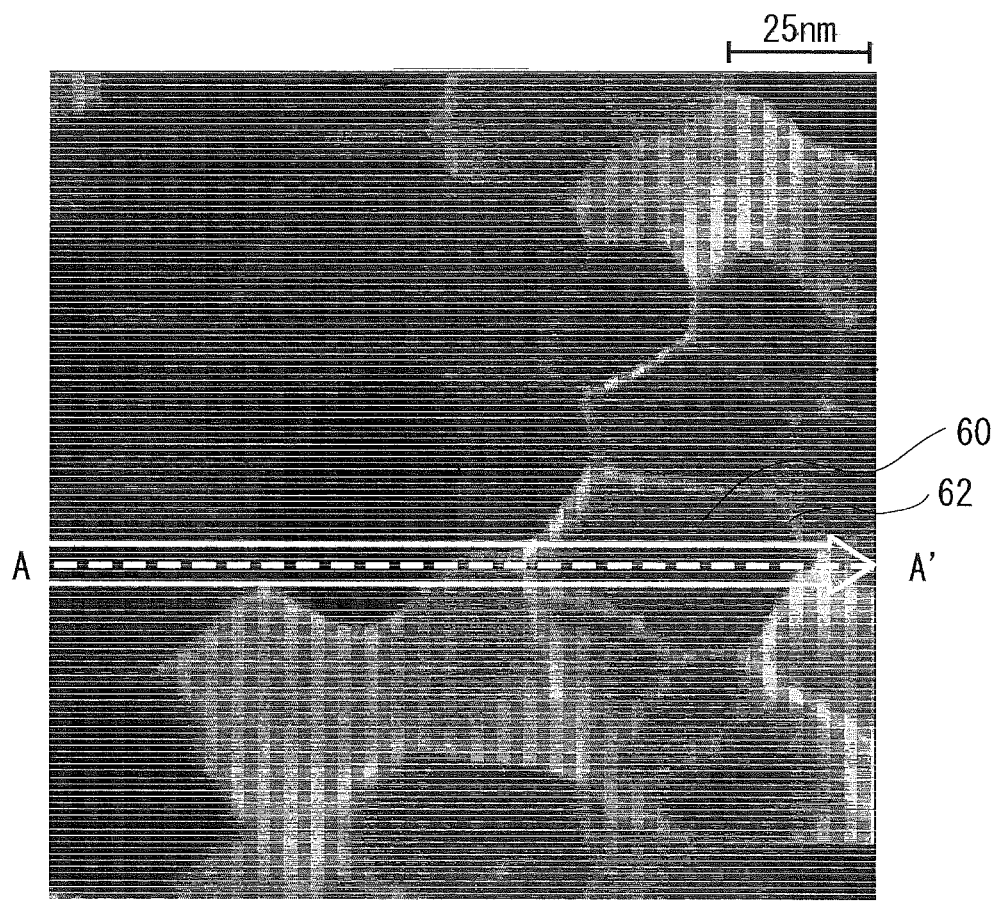
FIG. 6A is an HAADF-STEM image.
Figure 6B:
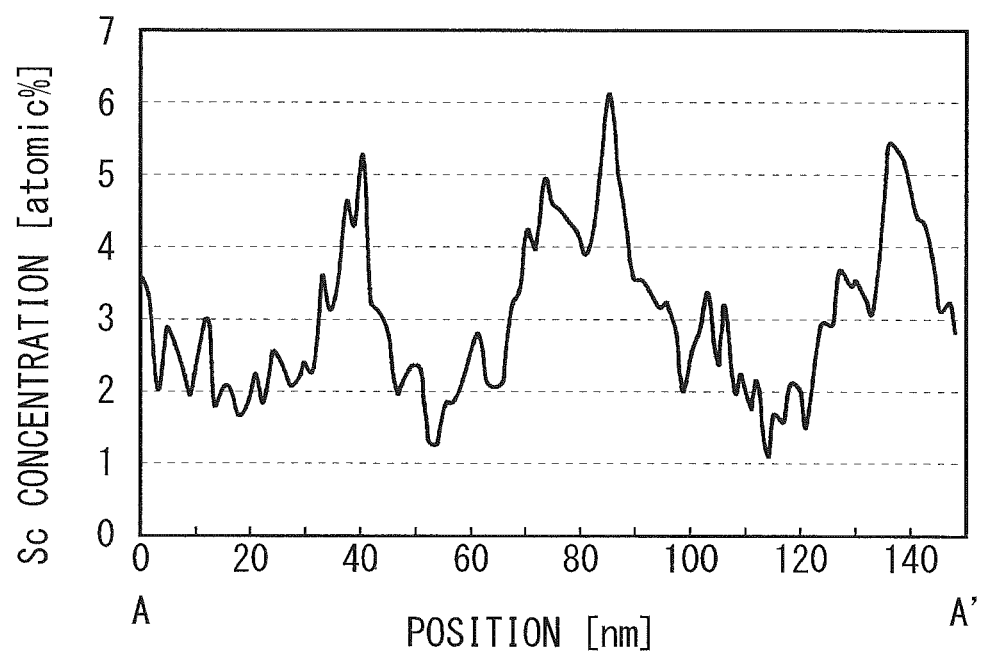
FIG. 6B illustrates results of the EDS line analysis in the arrow direction from A to A' in FIG. 6A.

The concentration of Sc in the center portion of the crystal grain and the concentration of Sc in the grain boundary were evaluated by EDS. FIG. 6A is an HAADF-STEM image, and FIG. 6B illustrates the result of the EDS line analysis in the arrow direction from A to A' in FIG. 6A. The spot diameter of the EDS line analysis is 1 nm, and the measurement pitch is 1.5 nm.

As illustrated in FIG. 6A and FIG. 6B, the Sc concentration in the grain boundary 62 is approximately 5 atomic %, and the Sc concentration in the crystal grain 60 is 2 to 3 atomic %. As seen above, when approximately 3 atomic % of Sc is added to AlN, Sc is distributed more around the grain boundary 62 than in the crystal grain 60. The reason why Sc is segregated around the grain boundary 62 is not clear.

Figure 5D:
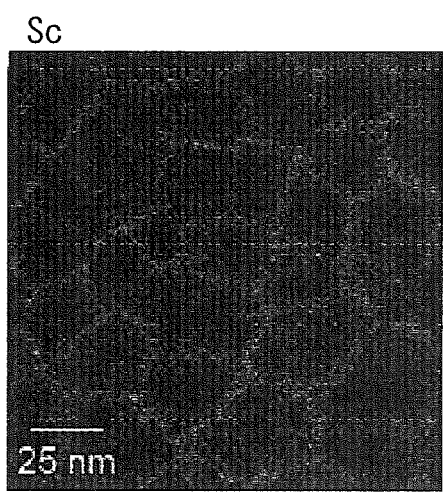
Figure 5E:
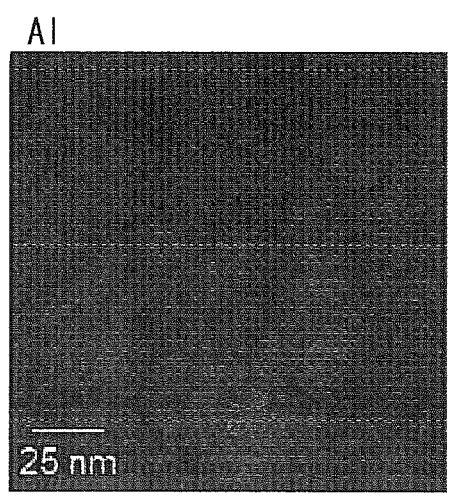
Figure 7A:
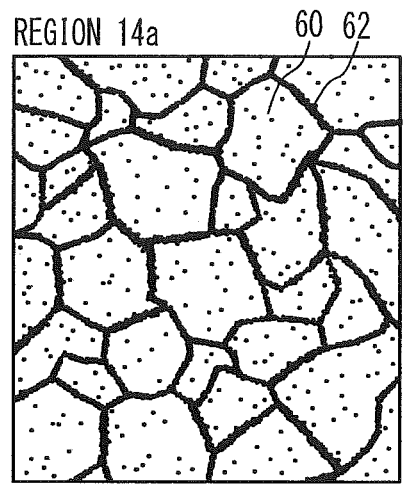
FIG. 7A through FIG. 7C are schematic views illustrating metal elements in crystal grains and grain boundaries in the first embodiment.
Figure 7B:
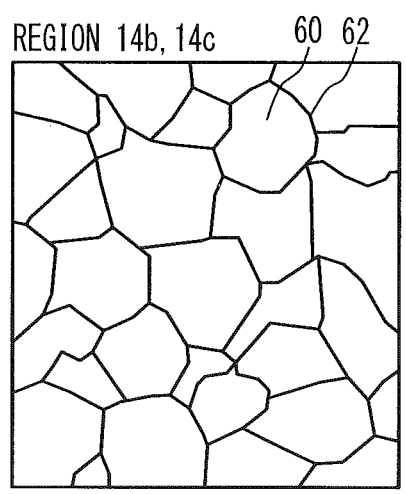
Figure 7C:
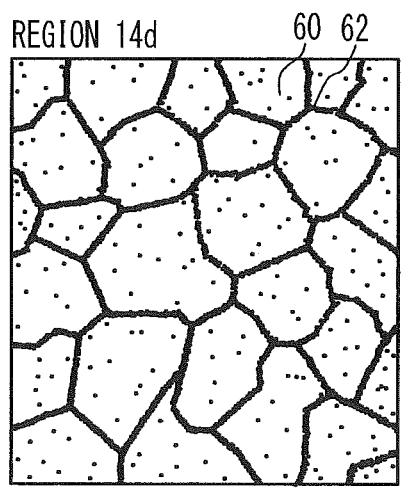

FIG. 7A through FIG. 7C are schematic views illustrating metal elements in the crystal grains and the grain boundaries in the first embodiment. A dark field image in the EDS surface analysis presented in FIG. 5D is schematically illustrated, and black points indicate metal elements M (for example, Sc). As illustrated in FIG. 7B, in the regions 14b and 14c, a small number of the metal elements M are present in both the crystal grain 60 and the grain boundary 62. As illustrated in FIG. 7A and FIG. 7C, in the regions 14a and 14d, the concentration of the metal element M in the crystal grain 60 is higher than the concentration of the metal element M in the crystal grain 60 in FIG. 7B. The concentrations of the metal element M near the grain boundary 62 in the regions 14a and 14d are higher than the concentrations of the metal element M in the center region of the crystal grain 60 in the regions 14a and 14d, respectively.

In the first embodiment, in the aluminum nitride film, the concentrations of the metal element M in the grain boundary 62 between the crystal grains 60 in the region 14a (a first region) and the region 14d (a second region), which are both end portions of the piezoelectric film 14 in the film thickness of the polycrystalline film, are higher than the concentrations of the metal element M in the center region of the crystal grain 60 in the regions 14a and 14d, respectively. As described above, the concentration of the metal element M other than aluminum in the grain boundary 62 is high. Accordingly, the crystal grains 60 in the grain boundary 62 are strongly bonded to each other, and thereby, introduction of cracks to the piezoelectric film 14 is inhibited. Cracks are formed in the boundary face between the piezoelectric film 14 and other films (for example, the lower electrode 12 and the upper electrode 16) or on the surface of the piezoelectric film 14. Thus, the concentrations of the metal element M in the grain boundary 62 in the regions 14a and 14d are configured to be high.

In addition, when the metal element M other than aluminum substitutes for aluminum, an inner stress, which is the compression stress of the piezoelectric film 14, increases. This causes cracks and/or peeling of the piezoelectric film 14. Thus, the concentrations of the metal element M in the grain boundary 62 in the regions 14a and 14d are higher than the concentration of the metal element M in the grain boundary 62 in the region 14b and/or 14c (a third region) located between the regions 14a and 14d in the film thickness direction of the polycrystalline film. Accordingly, the entire stress of the piezoelectric film 14 is reduced, and cracks and/or peeling of the film is inhibited. Therefore, the mechanical strength of the piezoelectric film 14 is enhanced.

The aluminum nitride crystal grain is mainly composed of aluminum nitride. For example, the total atomic concentration of Al and N in the aluminum nitride crystal grain is 50 atomic % or greater, more preferably 80 atomic % or greater. To enhance the piezoelectricity of the aluminum nitride film, the aluminum nitride crystal grain has a wurtzite-type crystal structure in which crystal grains are oriented in the c-axis.

The metal element M added to aluminum nitride is, for example, scandium. In addition, the aluminum nitride crystal grain may contain at least one of titanium, zirconium, and hafnium that substitute for aluminum and at least one of magnesium, calcium, strontium, and zinc that substitute for aluminum. In this case, it is sufficient if the metal element M distributed more in the grain boundary 62 is at least one of at least one of titanium, zirconium, and hafnium and at least one of magnesium, calcium, strontium, and zinc. For example, according to the experiments conducted by the inventors, in the aluminum nitride film to which Mg and Hf are added, Mg is distributed more in the grain boundary 62 than in the center region of the crystal grain 60.

The concentration of the metal element M in the grain boundary 62 in the region 14b and/or 14c is equal to or less than 50% of the concentrations of the metal element M in the grain boundary 62 in the regions 14a and 14d. This configuration strengthens the bonding of the crystal grains 60 in both end portions of the piezoelectric film 14, inhibits introduction of cracks, and reduces the inner stress of the piezoelectric film 14. The concentration of the metal element M in the grain boundary 62 in the region 14b and/or 14c is preferably equal to or less than 30% of the concentrations of the metal element M in the grain boundary 62 in the regions 14a and 14d, more preferably equal to or less than 10% of the concentrations of the metal element M in the grain boundary 62 in the regions 14a and 14d. The region 14b and/or 14c may not necessarily intentionally contain the metal element M.

The concentrations of the metal element M in the grain boundary 62 in the regions 14a and 14d are equal to or greater than 1.1 times the concentrations of the metal element M in the center region of the crystal grain 60 in the regions 14a and 14d, respectively. This configuration inhibits introduction of cracks in both end portions of the piezoelectric film 14. The concentrations of the metal element M in the grain boundary 62 in the regions 14a and 14d are equal to or greater than 1.1 times the concentrations of the metal element M in the center region of the crystal grain 60 in the regions 14a and 14d, respectively. The concentrations of the metal element M in the grain boundary 62 in the regions 14a and 14d are preferably equal to or greater than 1.15 times, more preferably equal to or greater than 1.2 times the concentrations of the metal element M in the center region of the crystal grain 60 in the regions 14a and 14d, respectively.

The thickness of each of the regions 14a and 14d is equal to or less than 20% of the thickness of the piezoelectric film 14. Even when the regions 14a and 14d are thin, a crack introduced into both end portions is reduced. On the other hand, since the regions 14b and 14c can be thickened, the inner stress of the piezoelectric film 14 can be reduced. The thickness of each of the regions 14a and 14d is preferably equal to or less than 10%, more preferably equal to or less than 5% of the thickness of the piezoelectric film 14. The thickness of each of the regions 14a and 14d is preferably equal to or greater than 0.1%, more preferably equal to or greater than 1% of the thickness of the piezoelectric film 14.

The concentrations of the metal element M in the grain boundary 62 in the regions 14a and 14d are preferably 2 atomic % or greater, more preferably 3 atomic % or greater, further preferably 5 atomic % or greater. The concentrations of the metal element M in the grain boundary 62 in the regions 14a and 14d are preferably 20 atomic % or less, more preferably 10 atomic % or less. The concentrations of the metal element M in the grain boundary 62 in the regions 14b and 14c are preferably 2 atomic % or less, more preferably 1 atomic % or less, further preferably 0.5 atomic % or less. The concentration of the metal element M can be measured by, for example, EDS.

First Variation of the First Embodiment

Figure 8A:
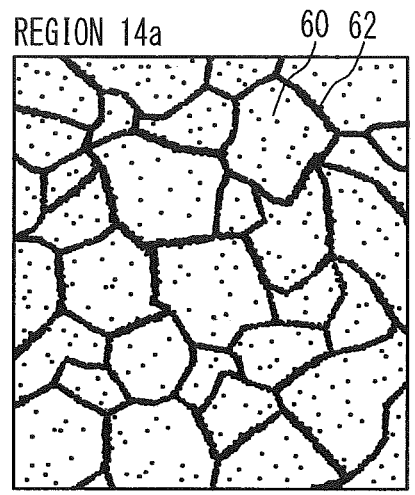
FIG. 8A through FIG. 8C are schematic views illustrating metal elements in crystal grains and grain boundaries in a first variation of the first embodiment.
Figure 8B:
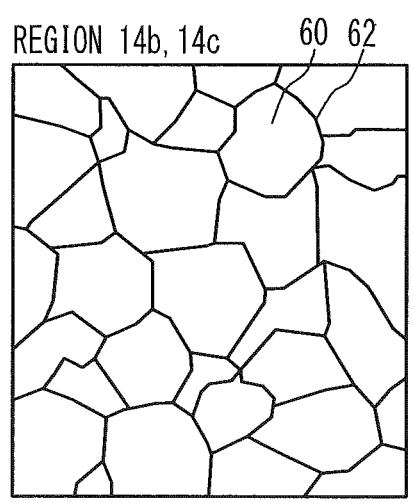
Figure 8C:
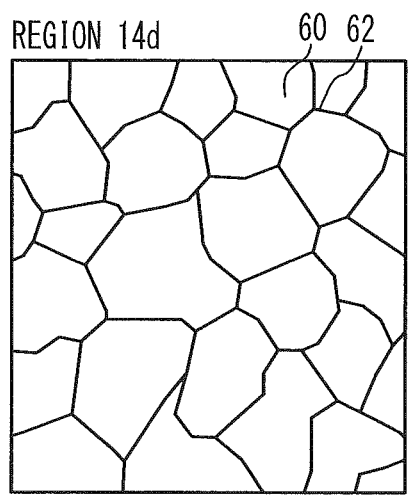

FIG. 8A through FIG. 8C are schematic views illustrating metal elements in the crystal grains and the grain boundaries in a first variation of the first embodiment. As illustrated in FIG. 8A and FIG. 8B, the distributions of the metal element M in the region 14a and the regions 14b and 14c are the same as those of the first embodiment. As illustrated in FIG. 8C, the concentration of the metal element M in the region 14d is approximately the same as those in the regions 14b and 14c.

Second Variation of the First Embodiment

Figure 9A:
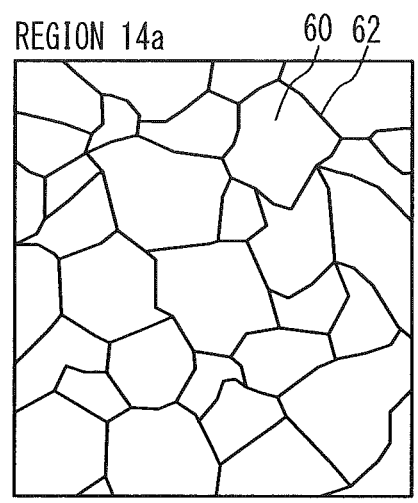
FIG. 9A through FIG. 9C are schematic views illustrating metal elements in crystal grains and grain boundaries in a second variation of the first embodiment.
Figure 9B:
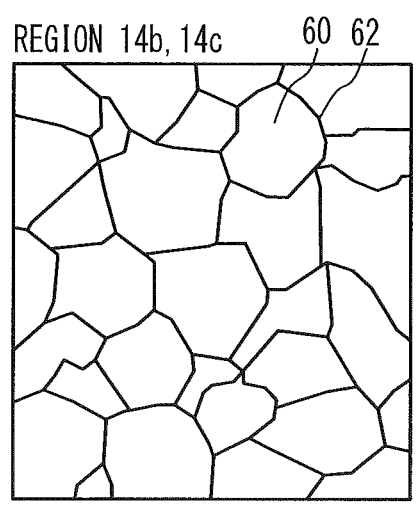
Figure 9C:
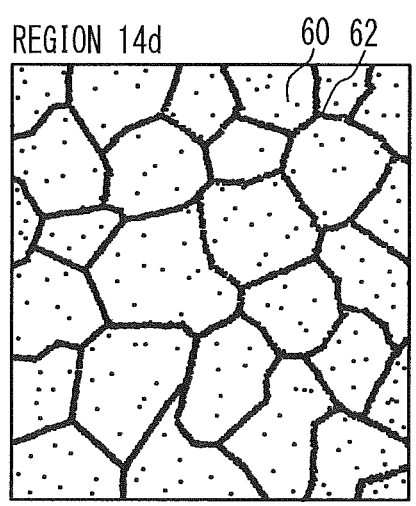

FIG. 9A through FIG. 9C are schematic views illustrating a metal element in the crystal grains and the grain boundaries in a second variation of the first embodiment. As illustrated in FIG. 9A, the concentration of the metal element M in the region 14a is approximately the same as those in the regions 14b and 14c. As illustrated in FIG. 9B and FIG. 9C, the distributions of the metal element M in the regions 14b and 14c and the region 14d are the same as those of the first embodiment.

As in the first and second variations of the first embodiment, it is sufficient if the concentration of the metal element M in the grain boundary 62 may be configured to be high in at least one of the regions 14a and 14d. The concentration of the metal element M in the grain boundary 62 in one of the regions 14a and 14d to which cracks are more easily introduced because of the structure outside the both end portions of the piezoelectric film 14 may be configured to be high. To reduce the secondary distortion, the first embodiment in which the regions 14a and 14d are symmetrical is preferable.

Third Variation of the First Embodiment

Figure 10A:
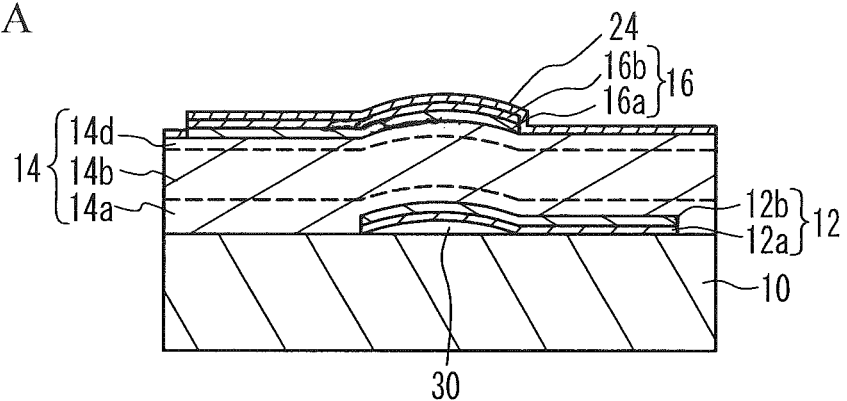
FIG. 10A through FIG. 10D are cross-sectional views of piezoelectric thin film resonators in accordance with third through sixth variations of the first embodiment, respectively.

FIG. 10A is a cross-sectional view of a piezoelectric thin film resonator in accordance with a third variation of the first embodiment. As illustrated in FIG. 10A, no insertion film is provided in the piezoelectric film 14. The piezoelectric film 14 has the regions 14a and 14d, which are both end portions in the film thickness direction, and the region 14b between the regions 14a and 14d. In at least one of the regions 14a and 14d, the concentration of the metal element M in the grain boundary 62 is higher than the concentration of the metal element M in the center region of the crystal grain 60. Other structures are the same as those of the first embodiment, and the description thereof is thus omitted.

As in the third variation of the first embodiment, the insertion film 28 may not be necessarily provided in the first embodiment and the variations thereof.

Fourth Variation of the First Embodiment

Figure 10B:
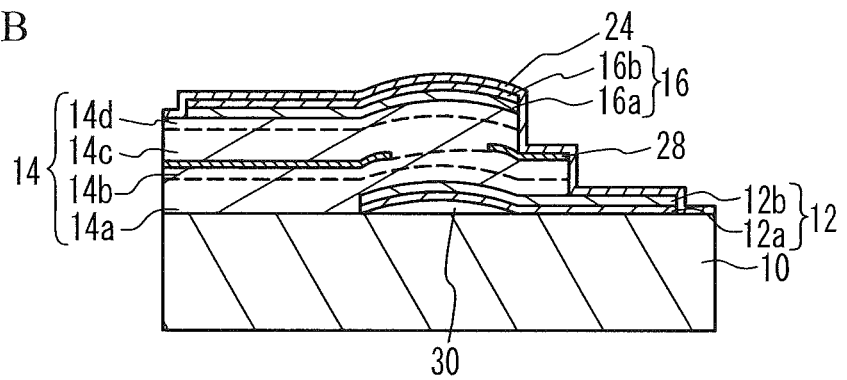

FIG. 10B is a cross-sectional view of a piezoelectric thin film resonator in accordance with a fourth variation of the first embodiment. As illustrated in FIG. 10B, in the extraction region of the lower electrode 12, the end faces of the regions 14c and 14d (an upper piezoelectric film) are substantially aligned with the outline of the resonance region 50. The end faces of the regions 14a and 14b (a lower piezoelectric film) are located further out than the outline of the resonance region 50. Other structures are the same as those of the first embodiment, and the description thereof is thus omitted.

As in the fourth variation of the first embodiment, the piezoelectric film 14 may be provided in a stepwise shape in the first embodiment and the variations hereof.

Fifth Variation of the First Embodiment

Figure 10C:
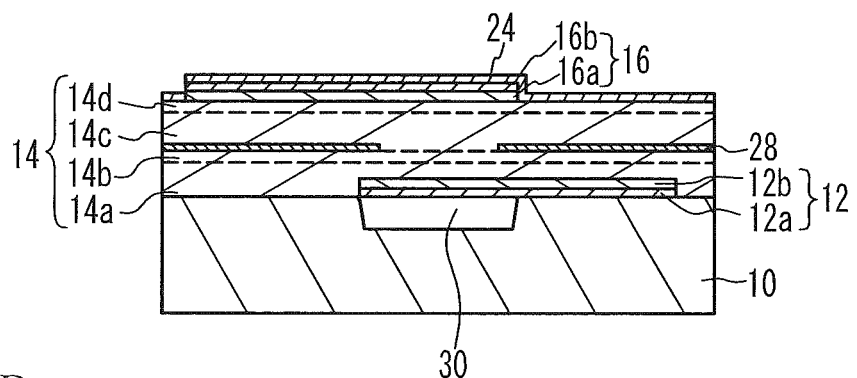

FIG. 10C is a cross-sectional view of a piezoelectric thin film resonator in accordance with a fifth variation of the first embodiment. As illustrated in FIG. 10C, a recess is formed on the upper surface of the substrate 10. The lower electrode 12 is flatly formed on the substrate 10. Thus, the air gap 30 is formed in the recess of the substrate 10. The air gap 30 is formed so as to include the resonance region 50. Other structures are the same as those of the first embodiment, and the description thereof is thus omitted. The air gap 30 may be formed so as to penetrate through the substrate 10.

Sixth Variation of the First Embodiment

Figure 10D:
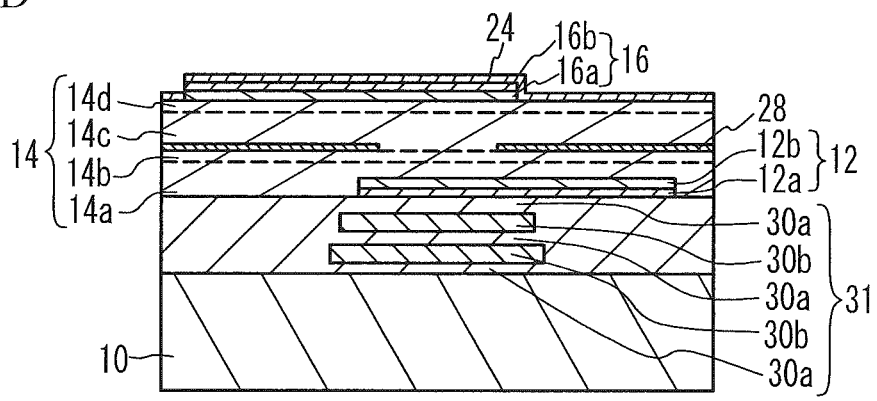

FIG. 10D is a cross-sectional view of a piezoelectric thin film resonator in accordance with a sixth variation of the first embodiment. As illustrated in FIG. 10D, an acoustic mirror 31 is formed under the lower electrode 12 of the resonance region 50. The acoustic mirror 31 includes a film 30a with low acoustic impedance and a film 30b with high acoustic impedance that are alternately provided. The film thickness of each of the films 30a and 30b is, for example, $\lambda/4$ ($\lambda$ represents the wavelength of the acoustic wave). The number of the films 30a and 30b to be stacked is freely selected. The acoustic mirror 31 is formed by stacking at least two layers with different acoustic characteristics at an interval. The substrate 10 may be one of two layers with different acoustic characteristics of the acoustic mirror 31. For example, the acoustic mirror 31 may have a structure in which a single film having different acoustic impedance from the substrate 10 is provided in the substrate 10. Other structures are the same as those of the first embodiment, and the description thereof is thus omitted.

In the first embodiment and the first through fourth variations thereof, the air gap 30 may be formed as in the fifth variation of the first embodiment, or the acoustic mirror 31 may be formed instead of the air gap 30 as in the sixth variation of the first embodiment.

As in the first embodiment and the first through fifth variations thereof, the piezoelectric thin film resonator may be a film bulk acoustic resonator (FBAR) in which the air gap 30 is formed between the substrate 10 and the lower electrode 12 in the resonance region 50. As in the sixth variation of the first embodiment, the piezoelectric thin film resonator may be a solidly mounted resonator (SMR) in which the acoustic mirror 31 reflecting the acoustic wave propagating through the piezoelectric film 14 is provided under the lower electrode 12 in the resonance region 50. It is sufficient if the acoustic reflection layer including the resonance region 50 includes the air gap 30 or the acoustic mirror 31.

In the first embodiment and the first, second, and fourth through sixth variations thereof, the insertion film 28 is located in the outer peripheral region 52 of the resonance region 50. However, it is sufficient if the insertion film 28 is located at least a part of the outer peripheral region 52 of the resonance region 50. The insertion film 28 may not be necessarily provided outside the resonance region 50. An elliptical shape has been described as an example of the planar shape of the resonance region 50, but the planar shape of the resonance region 50 may be a polygonal shape such as a quadrangle shape or a pentagonal shape.

In the first embodiment and the variations thereof, the piezoelectric thin film resonator has been described as an example of the acoustic wave device in which the aluminum nitride film is used, but the acoustic wave device in which the aluminum nitride film is used may be an acoustic wave device having an electrode that excites the acoustic wave propagating through the aluminum nitride film. For example, the acoustic wave device may be a resonator that uses a Lamb wave, and in which the comb-shaped electrodes is located on the aluminum nitride film. Such a resonator includes the substrate 10, the piezoelectric film 14 (an aluminum nitride film) located on the substrate 10, and the lower electrode 12 (a first electrode) and the upper electrode 16 (a second electrode) facing each other across at least a part of the piezoelectric film 14 in the c-axis orientation and being in contact with the region 14a and the region 14d, respectively.

The piezoelectric film 14 may be used in a piezoelectric device. The piezoelectric device in which the piezoelectric film 14 can be used is, for example, an actuator, a sensor, and the like in addition to the acoustic wave device. Examples of the actuator include, but are not limited to, a micropump for an ink-jet device, a radio frequency (RF)-micro electro mechanical system (MEMS), and an optical mirror. Examples of the sensor include, but are not limited to, an acceleration sensor, a gyro sensor, and an energy harvesting sensor.

Second Embodiment

Figure 11A:
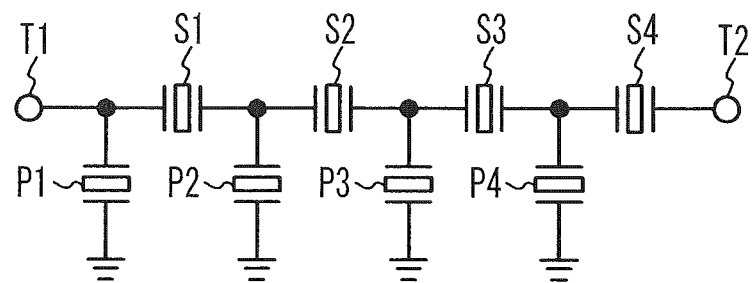
FIG. 11A is a circuit diagram of a filter in accordance with a second embodiment.

A second embodiment is an exemplary filter and an exemplary duplexer including the piezoelectric thin film resonator according to any one of the first embodiment and the variations thereof. FIG. 11A is a circuit diagram of a filter in accordance with the second embodiment. As illustrated in FIG. 11A, one or more series resonators S1 through S4 are connected in series between an input terminal T1 and an output terminal T2. One or more parallel resonators P1 through P4 are connected in parallel between the input terminal T1 and the output terminal T2. At least one of the one or more series resonators S1 through S4 and the one or more parallel resonators P1 through P4 can be the piezoelectric thin film resonator according to any one of the first embodiment and the variations thereof. The number of resonators in the ladder-type filter is freely selected.

Figure 11B:
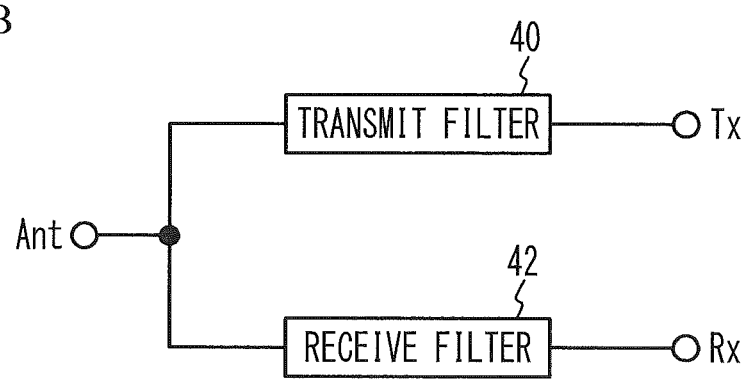
FIG. 11B is a circuit diagram of a duplexer in accordance with a first variation of the second embodiment.

FIG. 11B is a circuit diagram of a duplexer in accordance with a first variation of the second embodiment. As illustrated in FIG. 11B, a transmit filter 40 is connected between a common terminal Ant and a transmit terminal Tx. A receive filter 42 is connected between the common terminal Ant and a receive terminal Rx. The transmit filter 40 transmits, as transmission signals, signals in the transmit band to the common terminal Ant among signals input from the transmit terminal Tx, and suppresses signals with other frequencies. The receive filter 42 transmits, as reception signals, signals in the receive band to the receive terminal Rx among signals input from the common terminal Ant, and suppresses signals with other frequencies. At least one of the transmit filter 40 and the receive filter 42 can be the filter of the second embodiment.

A duplexer has been described as an example of the multiplexer, but the multiplexer may be a triplexer or a quadplexer.

Although the embodiments of the present invention have been described in detail, it is to be understood that the various change, substitutions, and alterations could be made hereto without departing from the spirit and scope of the invention.

What is claimed is:

1. An aluminum nitride film, wherein
   aluminum nitride crystal grains that contain a metal element, which is different from aluminum and substitutes for aluminum, are main crystal grains of a polycrystalline film formed of a plurality of crystal grains, and
   a concentration of the metal element in a grain boundary between the aluminum nitride crystal grains in at least one region of a first region and a second region, which correspond to both end portions of the polycrystalline film in a film thickness direction of the polycrystalline film, is higher than a concentration of the metal element in a center region of the aluminum nitride crystal grain in the at least one region, and is higher than a concentration of the metal element in a grain boundary between the aluminum nitride crystal grains in a third region located between the first region and the second region in the film thickness direction of the polycrystalline film.

2. The aluminum nitride film according to claim 1, wherein
   the metal element is scandium.

3. The aluminum nitride film according to claim 1, wherein
   the aluminum nitride crystal grains contain at least one of titanium, zirconium, and hafnium that substitute for aluminum, and at least one of magnesium, calcium, strontium, and zinc that substitute for aluminum, and the metal element is at least one of the at least one of titanium, zirconium, and hafnium, and the at least one of magnesium, calcium, strontium, and zinc.

4. The aluminum nitride film according to claim 1, wherein
the concentration of the metal element in the grain boundary between the aluminum nitride crystal grains in the third region is equal to or less than 10% of the concentration of the metal element in the grain boundary between the aluminum nitride crystal grains in the at least one region.

5. The aluminum nitride film according to claim 1, wherein
the concentration of the metal element in the grain boundary between the aluminum nitride crystal grains in the at least one region is equal to or greater than 1.1 times the concentration of the metal element in the center region of the aluminum nitride crystal grain in the at least one region.

6. The aluminum nitride film according to claim 1, wherein
a concentration of the metal element in a grain boundary between the aluminum nitride crystal grains in the first region and a concentration of the metal element in a grain boundary between the aluminum nitride crystal grains in the second region are respectively higher than a concentration of the metal element in a center region of the aluminum nitride crystal grain in the first region and a concentration of the metal element in a center region of the aluminum nitride crystal grain in the second region, and are higher than the concentration of the metal element in the grain boundary between the aluminum nitride crystal grains in the third region.

7. The aluminum nitride film according to claim 1, wherein
the aluminum nitride crystal grains have a wurtzite-type crystal structure in which the plurality of crystal grains are oriented in a c-axis.

8. A piezoelectric device comprising:
a substrate;
an aluminum nitride film in which aluminum nitride crystal grains that contain a metal element, which is different from aluminum and substitutes for aluminum, are main crystal grains of a polycrystalline film formed of a plurality of crystal grains, and a concentration of the metal element in a grain boundary between the aluminum nitride crystal grains in at least one region of a first region and a second region, which correspond to both end portions of the polycrystalline film in a film thickness direction of the polycrystalline film, is higher than a concentration of the metal element in a center region of the aluminum nitride crystal grain in the at least one region, and is higher than a concentration of the metal element in a grain boundary between the aluminum nitride crystal grains in a third region located between the first region and the second region in the film thickness direction of the polycrystalline film, the aluminum nitride film being located on the substrate; and
a first electrode and a second electrode facing each other across at least a part of the aluminum nitride film in the film thickness direction, the first electrode being in contact with the first region, the second electrode being in contact with the second region.

9. A resonator comprising:
a substrate;
an aluminum nitride film in which aluminum nitride crystal grains that contain a metal element, which is different from aluminum and substitutes for aluminum, are main crystal grains of a polycrystalline film formed of a plurality of crystal grains, and a concentration of the metal element in a grain boundary between the aluminum nitride crystal grains in at least one region of a first region and a second region, which correspond to both end portions of the polycrystalline film in a film thickness direction of the polycrystalline film, is higher than a concentration of the metal element in a center region of the aluminum nitride crystal grain in the at least one region, and is higher than a concentration of the metal element in a grain boundary between the aluminum nitride crystal grains in a third region located between the first region and the second region in the film thickness direction of the polycrystalline film, the aluminum nitride film being located on the substrate; and
a first electrode and a second electrode facing each other across at least a part of the aluminum nitride film in the film thickness direction, the first electrode being in contact with the first region, the second electrode being in contact with the second region.

10. A filter comprising:
the resonator according to claim 9.

11. A multiplexer comprising:
the filter according to claim 10.

* * * * *